(12) United States Patent
Lenchenkov

(10) Patent No.: US 8,368,157 B2
(45) Date of Patent: Feb. 5, 2013

(54) BACKSIDE ILLUMINATION IMAGE SENSORS WITH REFLECTIVE LIGHT GUIDES

(75) Inventor: Victor Lenchenkov, Sunnyvale, CA (US)

(73) Assignee: Aptina Imaging Coporation, George Town (KY)

( * ) Notice: Subject to any disclaimer, the term of this patent is extended or adjusted under 35 U.S.C. 154(b) by 366 days.

(21) Appl. No.: 12/755,351

(22) Filed: Apr. 6, 2010

(65) Prior Publication Data
US 2011/0241145 A1 Oct. 6, 2011

(51) Int. Cl.
H01L 27/146 (2006.01)
H01L 31/0232 (2006.01)
H01L 31/18 (2006.01)

(52) U.S. Cl. . 257/432; 257/436; 257/447; 257/E31.127; 257/E27.133; 438/69

(58) Field of Classification Search .................. 257/432, 257/436, 447
See application file for complete search history.

(56) References Cited

U.S. PATENT DOCUMENTS

| | | | |
|---|---|---|---|
| 3,682,528 A | 8/1972 | Apfel et al. | |
| 5,246,803 A | 9/1993 | Hanrahan et al. | |
| 5,790,188 A | 8/1998 | Sun | |
| 6,638,668 B2 | 10/2003 | Buchsbaum et al. | |
| 2005/0236553 A1* | 10/2005 | Noto et al. | 250/208.1 |
| 2010/0171191 A1* | 7/2010 | Lee | 257/432 |

OTHER PUBLICATIONS

Lenchenkov, Victor. U.S. Appl. No. 12/537,128, filed Aug. 6, 2009.

* cited by examiner

Primary Examiner — Ha Tran T Nguyen
Assistant Examiner — Raj R Gupta
(74) Attorney, Agent, or Firm — Treyz Law Group; Jason Tsai

(57) ABSTRACT

Image sensors with backside illumination image pixel arrays are provided. An image pixel array may have image pixels that are formed on a silicon substrate having front and back surfaces. The pixel array may have photodiodes formed in the front surface. A dielectric stack may be formed on the front surface. The dielectric stack may include interconnect structures and reflective light guides. A color filter array may be formed on the back surface of the substrate. Microlenses may be formed on the color filter array from the side facing the back surface. The pixel array may receive incoming light through the microlenses. The incoming light may enter the substrate through the back surface. The incoming light may penetrate the substrate and may be reflected by a light reflector in the reflective light guide back towards the photodiode. The image pixel array may exhibit improved quantum efficiency, sensitivity, and image contrast.

20 Claims, 7 Drawing Sheets

BACKSIDE ILLUMINATION IMAGE SENSORS WITH REFLECTIVE LIGHT GUIDES

BACKGROUND

This relates generally to image sensors, and more specifically, to backside illumination image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A dielectric stack is formed on the front surface of the substrate directly on top of the photodiodes. The dielectric stack includes metal routing lines and metal vias formed in dielectric material. Light guides are often formed in the dielectric stack to guide the trajectory of incoming light.

A color filter array is formed over the dielectric stack to provide each pixel with sensitivity to a certain range of wavelengths. Microlenses may be formed over the color filter array. Light enters from a front side of the image sensor (i.e., light enters the microlenses and travels through the color filters into the dielectric stack). An image sensor used in this way is referred to as a frontside illumination (FSI) image sensor.

It is desired to use the light guides to direct the incoming light into the photodiodes. The incoming light, however, is sometimes reflected and absorbed by the metal routing lines and vias when traversing the dielectric stack. This results in undesirable pixel crosstalk and signal degradation.

To address these issues, backside illumination image sensors have been developed. These sensors are, however, also subject to crosstalk due to light scattering from metal routing lines and vias.

It would therefore be desirable to be able to provide image sensors with improved performance.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image pixels. The pixels in the image sensors may include photosensitive elements such as photodiodes that convert the incoming light into digital data. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
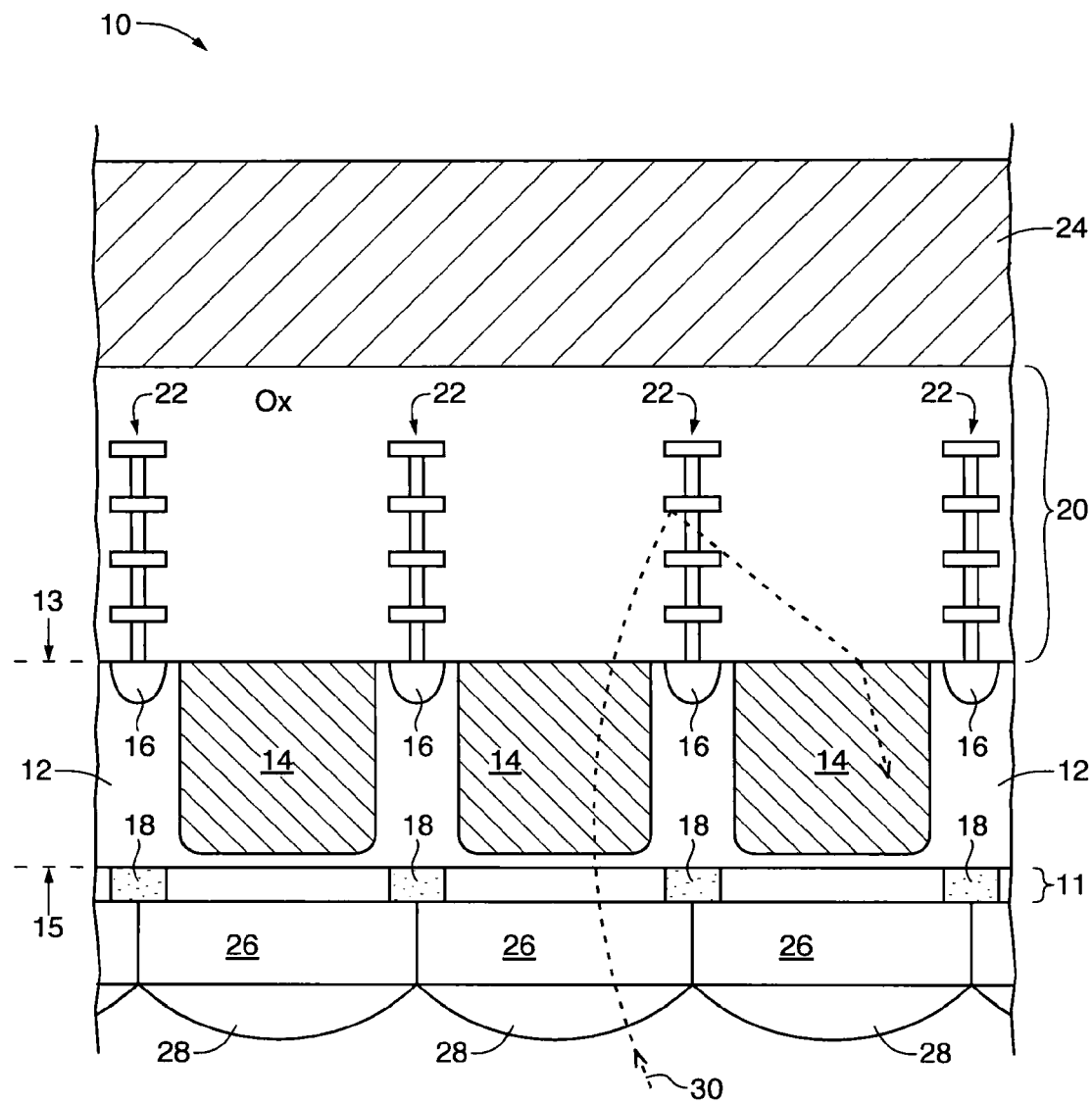
FIG. 1 is a cross-sectional side view of a conventional backside illumination image pixel array.

FIG. 1 is a cross-sectional side view of an image pixel array 10. Pixel array 10 includes conventional backside illumination image pixels arranged in an array. Each pixel has a photodiode 14 formed in a front side of p-type epitaxial silicon substrate 12. Each pixel also has an associated floating diffusion region 16 formed in the front side of substrate 12.

A dielectric stack 20 is formed on front surface 13 of substrate 12. Dielectric stack 20 includes metal interconnect structures 22 formed in dielectric material (e.g., silicon dioxide). A silicon carrier board 24 is formed on dielectric stack 20.

A color filter array 26 is formed on back surface 15 of substrate 12. A respective microlens 28 covers each color filter pixel element 26. Each pixel has a metal light ring 18 formed on the back surface of substrate 12 in a dielectric layer 11. Metal light ring 18 lines the perimeter of each color filter 26 and serves as a light block to prevent pixel crosstalk.

Light can enter from the back side of the image pixels through microlenses 28. The incoming light is partially absorbed by photodiode 14. The remaining portion of the incoming light penetrates through substrate 12 into dielectric stack 20. The remaining portion of the incoming light may reflect off interconnect structures 22 and may be absorbed in an adjacent photodiode 14, resulting in pixel crosstalk (see, e.g., the dotted trajectory 30 of the incoming light in FIG. 1).

Figure 2:
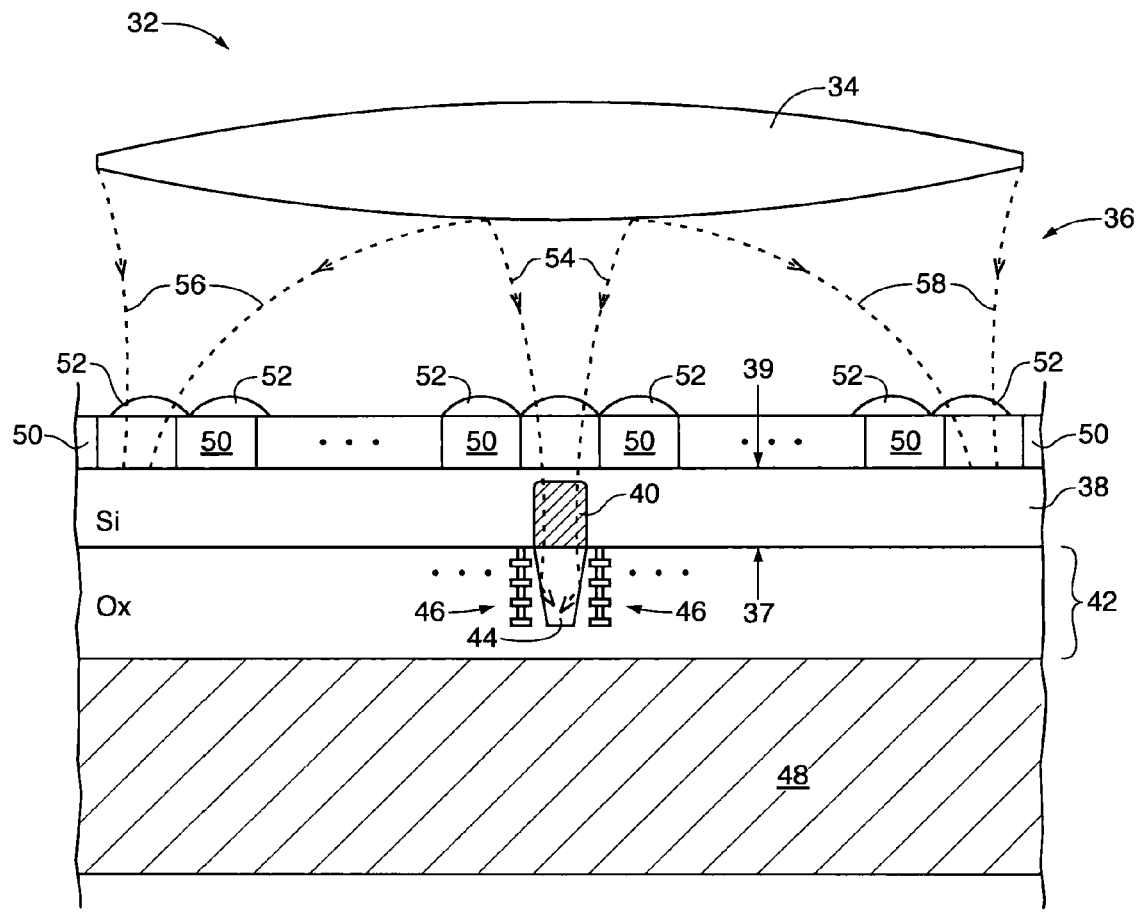
FIG. 2 is a diagram of an illustrative backside illumination image sensor with light guides in accordance with an embodiment of the present invention.

FIG. 2 is a diagram of an illustrative image sensor 32 that may exhibit reduced crosstalk. Image pixel array 36 may include a p-type silicon substrate 38. Substrate 38 may have a front surface 37 and a back surface 39. Any process that is performed from the side facing the front surface may be referred to as a frontside process while any process that is performed from the side facing the back surface may be referred to as a backside process.

Structures such as photodiodes and transistors may be formed in the front surface of the substrate. A dielectric stack that includes a reflective light guide may be formed on the front surface of the substrate. Color filters and microlenses may be placed on the back surface of the substrate. Incoming light may enter the image sensor through the microlenses and may enter the substrate by first striking the back surface. The incoming light may traverse a given photodiode in the substrate and may be reflected back towards the given photodiode by the reflective light guide.

More specifically, substrate 38 may include structures such as photodiodes 40, diffusion regions for transistors, and other circuitry formed in its front surface. For example, photodiodes 40 may have n-type doping regions that are formed by implanting n-type dopants from the front side of substrate 38.

A dielectric stack 42 may be formed on the front surface of substrate 38. Dielectric stack 42 may include layers of silicon oxide or other dielectrics within which conductive structures are formed. A dielectric stack typically includes metal interconnect layers (also sometimes referred to as metal layers or metal routing layers) and via layers. The metal routing layers may include metal routing lines (also sometimes referred to as interconnects). The via layers may contain vertical conducting structures (e.g., conductive vias such as tungsten vias or other metal vias). If desired, metal may be omitted from a portion of a metal layer or via layer (e.g., to form a region of uninterrupted dielectric).

Dielectric stack 42 may include interconnect structures 46 (e.g., metal routing lines and vias) and light guides 44. Interconnect structures 46 may be electrically connected to each image pixel, to gates of the transistors, and to terminals of the other circuits formed in the front surface of substrate 38. A carrier such as silicon carrier board 48 may be formed on dielectric layer 42 from the front side, as shown in FIG. 2. Carrier board 48 may serve to provide mechanical support for image pixel array 36.

A color filter array having color filters 50 may be formed on back surface 39 of substrate 38. Each color filter 50 may serve to filter incoming light for a respective photodiode 40. Color filters 50 may include green filters, red filters, blue filters, yellow filters, cyan filters, magenta filters, or other types of filters. As an example, a green filter passes green light (e.g., light with wavelengths from 495 nm to 570 nm) and reflects and/or absorbs light out of that range (e.g., the green filter reflects red light and blue light).

An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

A microlens 52 may be formed on each respective color filter 50 from the back side of the image pixel array. Each microlens 52 may be used to concentrate incoming light onto an associated photodiode 40.

Image sensor 32 may include a lens 34 that is formed over microlenses 52 from the back side of image pixel array 36, as shown in FIG. 2. Lens 34 may be used to focus light onto image pixel array 36. Microlenses 52 that are located near the center of the pixel array may be substantially aligned with their associated color filters and photodiodes to help direct incoming light towards the respective photodiodes, as indicated by light trajectory 54 in FIG. 2. Microlenses 52 that are located near the edges of the pixel array may be horizontally offset with respect to their associated color filter arrays and photodiodes to help direct incoming light towards the respective photodiodes (see, e.g., light trajectories 56 and 58). Image sensors of the type described in connection with FIG. 2 may sometimes be referred to as backside illumination (BSI) image sensors, because light enters from the back side of the image sensors (e.g., incoming light enters the substrate through the back surface of substrate 38).

Figure 3:
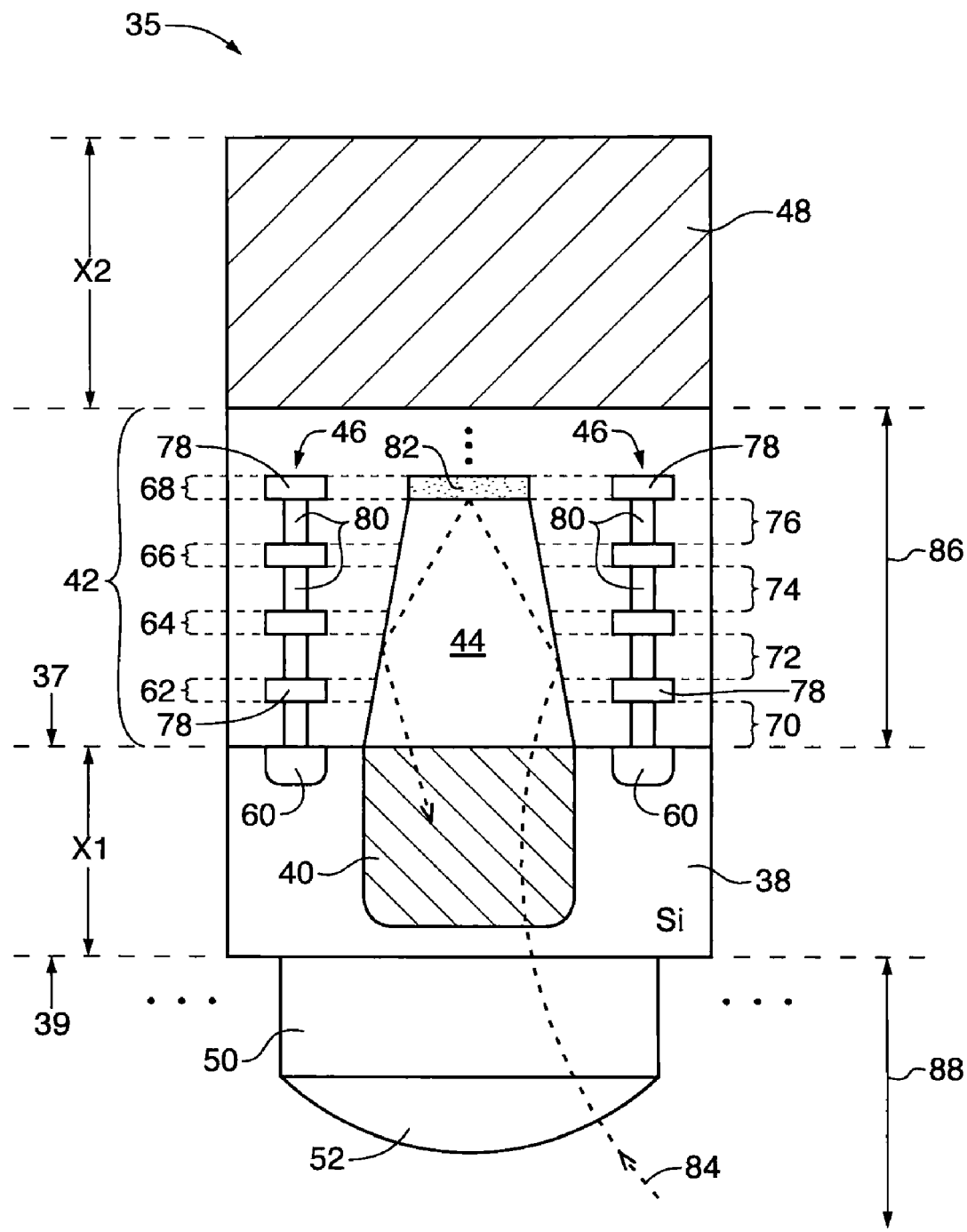
FIG. 3 is a cross-sectional side view of an illustrative backside illumination pixel with a light guide in accordance with an embodiment of the present invention.

FIG. 3 shows a single pixel 35 of pixel array 36 in detail. Substrate 38 may include floating diffusion (FD) regions 60 formed in its front surface 37. Floating diffusion regions may be n+ doped regions (as an example). Structures (e.g., dielectric stack 42 and carrier 48) that are formed in region 86 are said to be formed on the front side of pixel 35 while structures (e.g., color filters 50 and microlenses 52) that are formed in region 88 said to be formed on the back side of pixel 35.

Substrate 38 may have a thickness X1. Thickness X1 may be two to five microns. If desired, the thickness of substrate 38 may be less than two microns or more than five microns. Carrier 48 may have a thickness X2. Thickness X2 may be several hundred microns or over a thousand microns, if desired. Carrier 48 may have sufficient thickness X2 to prevent light from reaching the front surface of the substrate through carrier 48. Carrier 48 formed on the front side of image pixel 35 is substantially thicker than silicon substrate 38 and helps provide structural support for the sensor.

Interconnect structures 46 formed in dielectric stack 42 may be electrically connected to FD regions 60. Structures 46 may include conductive lines 78 connected through vias 80.

For example, metal lines 78 may be formed in a first metal routing layer 62, a second metal routing layer 64, a third metal routing layer 66, and a fourth metal routing layer 68, as shown in FIG. 3. Metal vias 80 may be formed in via layers 70, 72, 74, and 76. Dielectric stack 42 may have more than four metal layers, if desired.

Light guide 44 may be formed in dielectric stack 42 on the front side of the image sensor and adjacent to associated photodiode 40. Light guide 44 may have interconnect structures 46 formed on each side (i.e., structure 46 may surround all sides of light guide 44). Light guide 44 may be formed using silicon nitride (as an example). Light guide 44 may have a higher index of refraction than the surrounding dielectric material. For example, silicon nitride of light guide 44 has a refractive index of 2.0 while silicon oxide that surrounds light guide 44 has a refractive index of 1.5. A light guide formed in this way may support internal reflection for light striking at a wide range of angles.

Light guide 44 may include a metal reflector 82 formed in fourth metal layer 68. In general, metal reflector 82 of light guide 44 may be formed in any metal routing layer of the dielectric stack. Due to the presence of metal reflector 82, light guide 44 may sometimes be referred to as a reflective light guide.

Image pixel 35 with reflective light guide 44 may exhibit improved quantum efficiency, which is a measure of the effectiveness with which photons are absorbed by a photodiode. For example, consider a scenario in which a red pixel (i.e., an image pixel having a red filter) having an epitaxial substrate 38 with a thickness of three microns receives incoming light. The incoming light may be filtered by the red filter to produce a red light. The red light may have a relatively long wavelength of 700 nm (as an example) and may not be fully absorbed by photodiode 40. The red light may therefore penetrate through substrate 38 and enter light guide 44. Light guide 44 may use light reflector 82 to reflect the red light back towards substrate 38 into photodiode 40 for additional absorption, as indicated by arrow 84 in FIG. 3.

Passing light through photodiode twice in this way may provide a quantum efficiency of 95% while a conventional BSI image pixel can only provide a quantum efficiency of 50%, because it only passes light once through the photodiode. A higher quantum efficiency results in better dynamic range, increased sensitivity, and improved contrast in the image captured by the image sensor.

Reflective light guide 44 may effectively double the thickness of the epitaxial silicon substrate without actually forming a thicker substrate. In this example, the effective thickness of substrate 38 is six μm (two times three microns), because light is allowed to be absorbed twice using the photodiode. This property allows for formation of a thin (i.e., a thickness of less than 3 μm) epitaxial substrate. Thin substrates may be desirable for pixel crosstalk minimization, because thin substrates decrease the chance of incoming light interfering with adjacent pixels as the light passes through the substrate.

If desired, reflector 82 may be formed using multilayer interference filter structure. Forming a multilayer interference filter in dielectric stack 42 may require several interconnect layers (i.e., this type of arrangement may require multiple metal routing layers and via layers). Multilayer interference filters may include several layers of material having alternating high and low indices of refraction. For example, a layer with a low index of refraction may be adjacent to a layer with a higher index of refraction. This pattern may be repeated and optimized to provide desired filtering capabilities (i.e., a Bragg-type filter). The layers of material can be formed from silicon oxide, silicon nitride, silicon carbide, titanium oxide, tin oxide, hafnium oxide, zinc oxide, or other transparent dielectric materials.

For example, a multilayer inference filter (formed in a light guide in a red pixel) that reflects red light may provide the same functionality as a metal reflector.

Consider another scenario in which a blue pixel (i.e., an image pixel having a blue filter) having an epitaxial substrate 38 with a thickness of three microns receives incoming light. The incoming light may be filtered by the blue filter to produce a blue light. The blue light may have a relatively short wavelength of 450 nm and may be fully absorbed by photodiode 40, because blue light can only penetrate substrate 38 at a depth of 1.5 um (as an example).

Consider another scenario in which a green pixel (i.e., an image pixel having a green filter) having an epitaxial substrate 38 with a thickness of three microns receives incoming light. The incoming light may be filtered by the green filter to produce a green light. The green light may have an intermediate wavelength of 530 nm and may not be fully absorbed by photodiode 40. In this example, light guide 44 may be used to reflect the unabsorbed portion of the green light back into photodiode 40 for a second pass of absorption.

Figure 4:
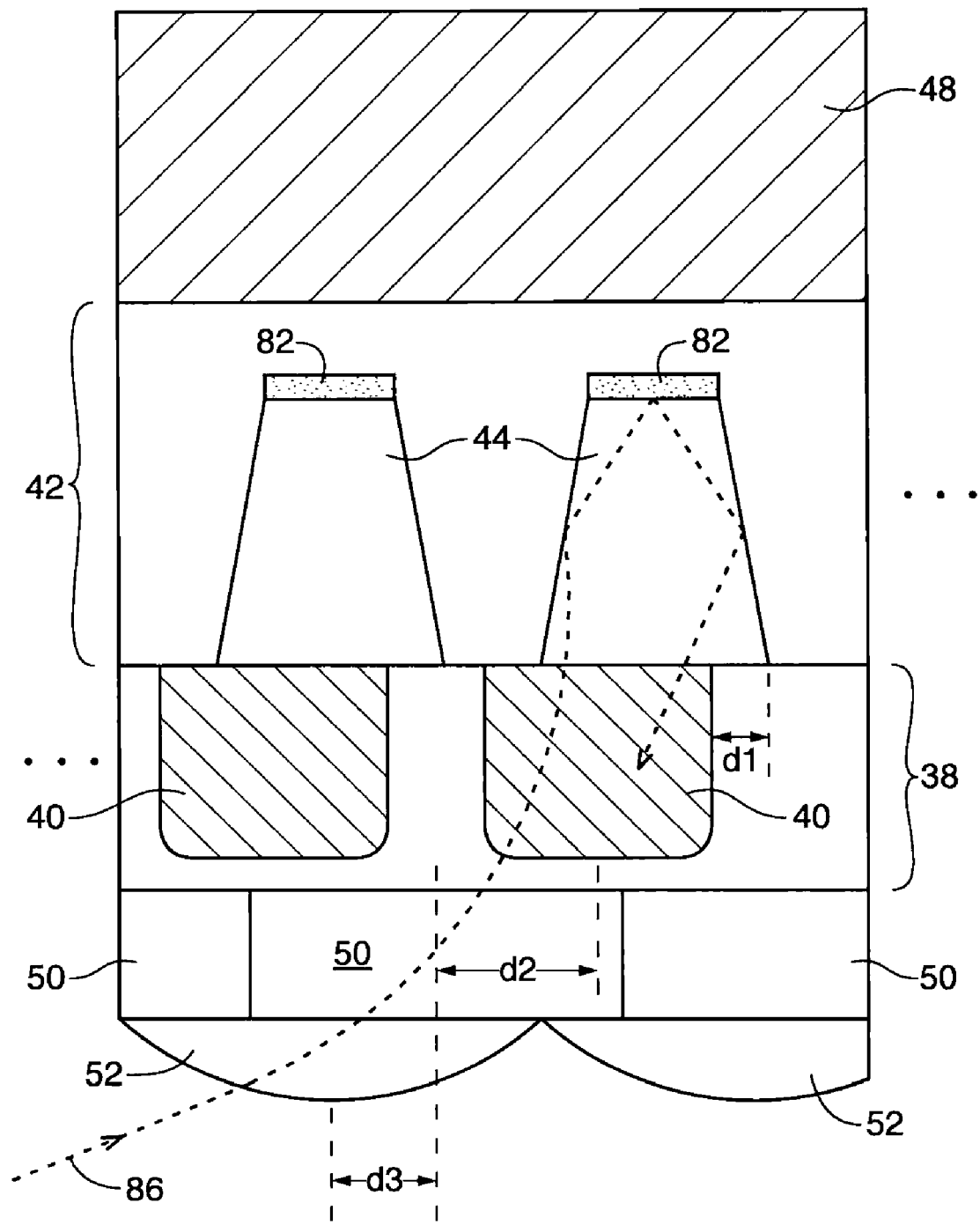
FIG. 4 is a cross-sectional side view of an illustrative backside illumination pixel array with structures that are horizontally (laterally) offset from one another in accordance with an embodiment of the present invention.

As described in connection with FIG. 2, the different structures (e.g., color filter, microlens, and light guide) in each image pixel that is located at the boundary of the image pixel array may be laterally offset with respect to the photodiode for that pixel. As shown in FIG. 4, light guide 44 may be laterally offset by a distance d1 with respect to associated photodiode 40. Color filter 50 may be laterally offset by a distance d2 with respect to the associated photodiode. Microlens 52 may be laterally offset by a distance d3 with respect to the associated color filter. The different image sensor structures that are laterally offset using this arrangement may direct incoming light so that it is optimally absorbed by photodiode 40 (see, e.g., light trajectory 86).

Figure 5:
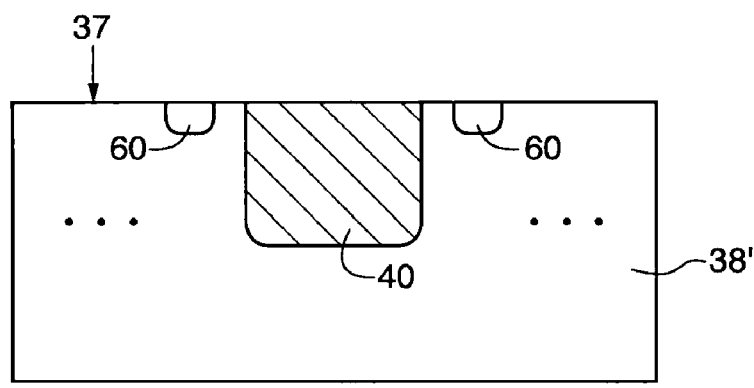
FIGS. 5-9 are cross-sectional side views showing illustrative steps involved in forming the backside illumination image pixel of FIG. 3 in accordance with an embodiment of the present invention.

FIGS. 5-9 are cross-sectional side views showing illustrative steps involved in forming the image pixel array of FIG. 2. Initially, photodiodes 40 and floating diffusion regions 60 may be formed in the front surface 37 of p-type epitaxial silicon substrate 38', as shown in FIG. 5. Photodiodes 40 may extend into the front surface of the substrate up to a given depth. Substrate 38' may be several hundred microns thick (as an example).

Figure 6:
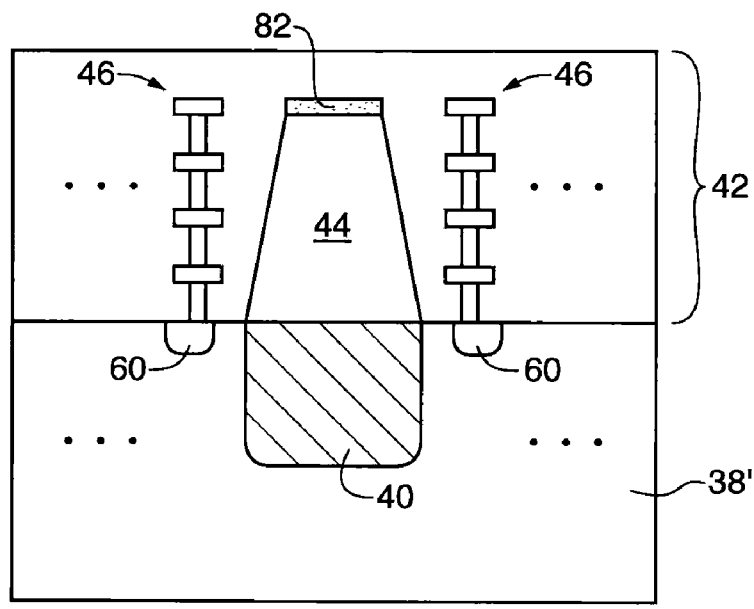

Dielectric stack 42 may be formed on the front surface of substrate 38' (FIG. 6). Dielectric layer 42 may include interconnect structures that are connected to diffusion regions 60 and may include light guides 44 having reflectors 82. FIG. 6 shows a dielectric stack 42 with three metal layers. If desired, any number of metal layers may be used to form interconnect structures 46 and reflective light guides 44.

Figure 7:
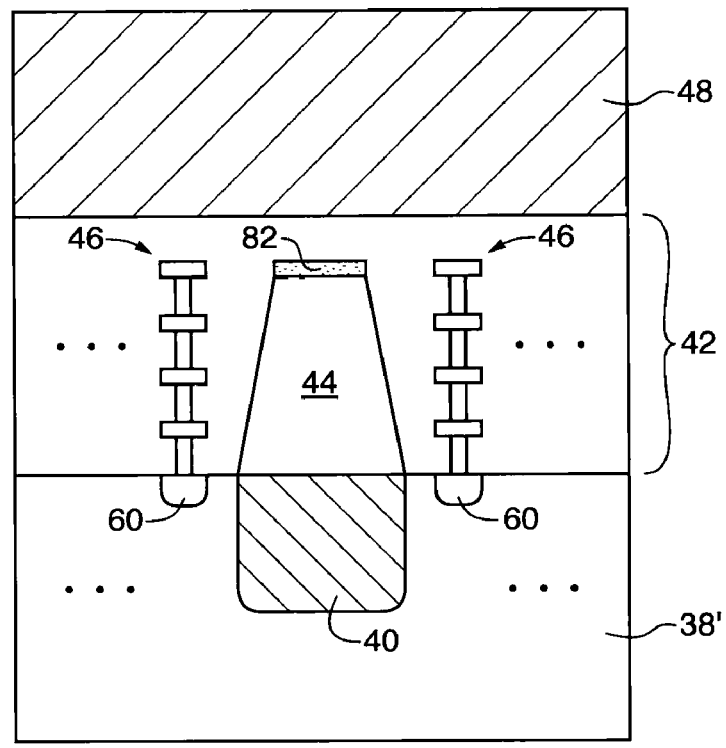

As shown in FIG. 7, silicon carrier board 48 may be placed on dielectric stack 42 from the front side of the image pixel array.

Figure 8:
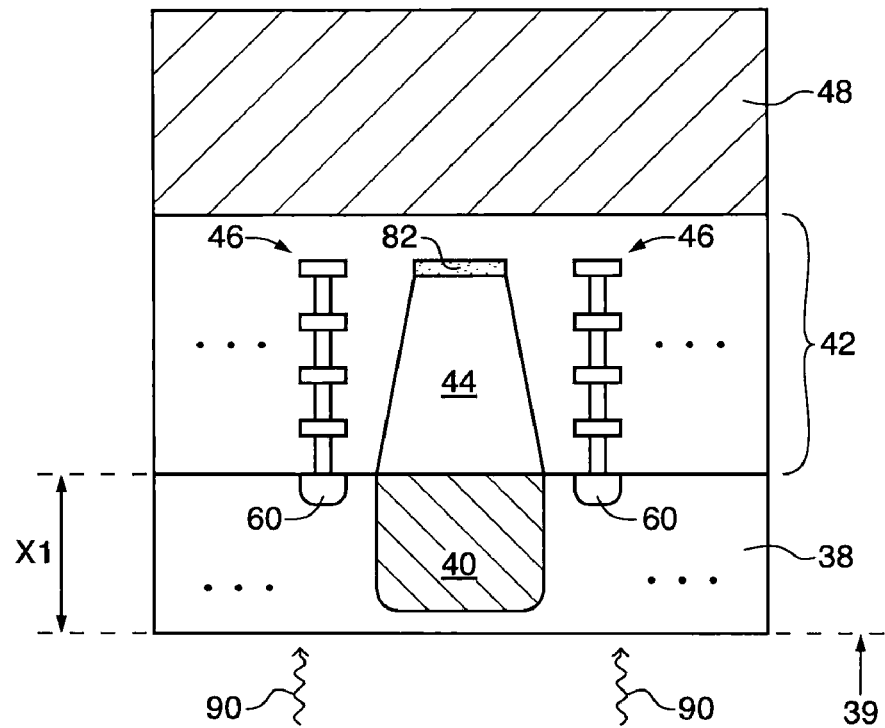
Figure 9:
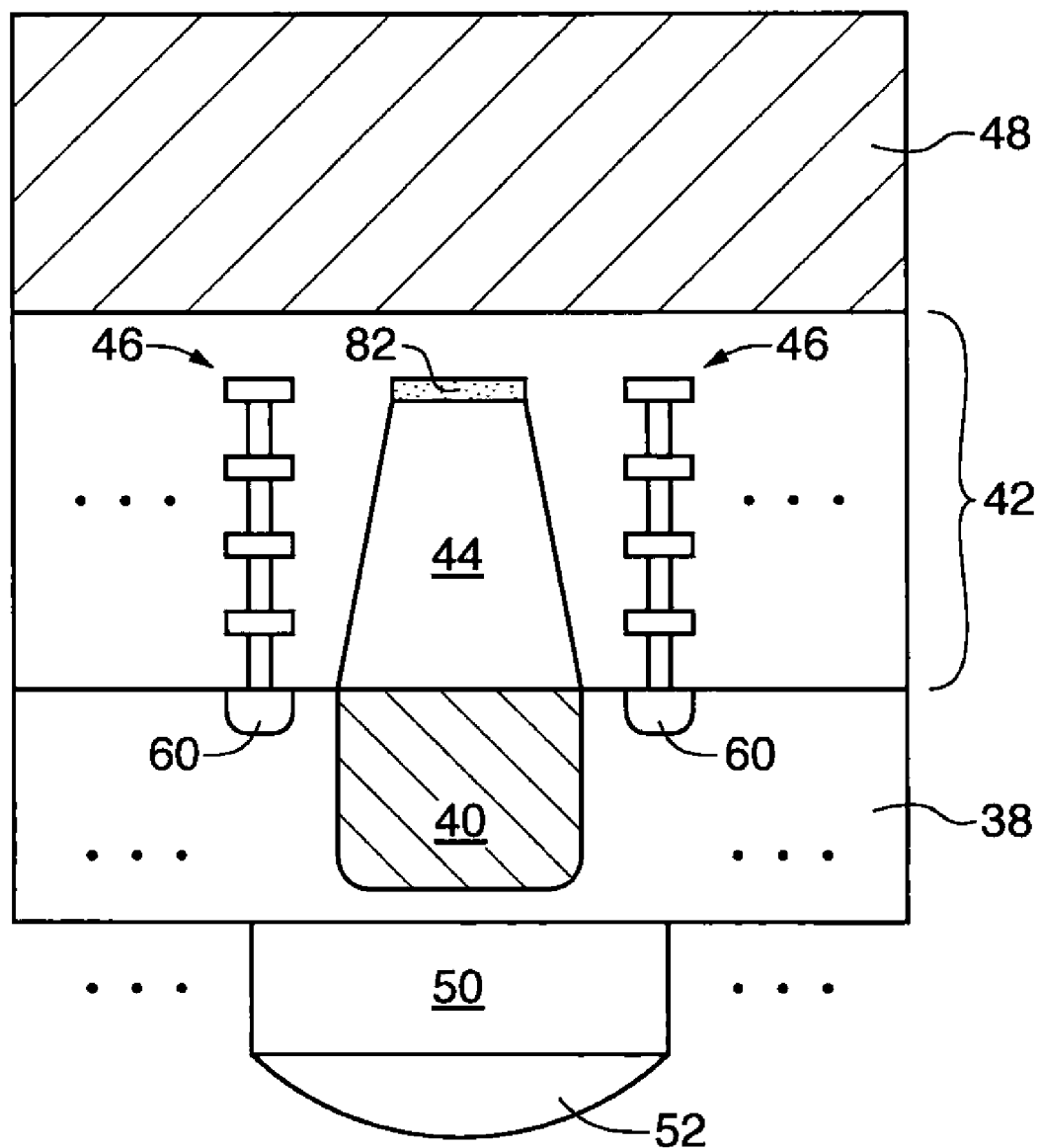

Substrate 38' may then be polished in the direction of arrows 90 of FIG. 8 to then form substrate 38' and thereby form substrate 38 with thickness X1, as shown in FIG. 9. Thickness X1 may, for example, be 2 to 4 microns. The thickness of substrate 38 may be slightly greater than the given depth of photodiodes 40. The polished surface may be referred to as back surface 39 of substrate 38.

Color filters 50 may then be formed on the back surface of substrate 38 (FIG. 9). Microlenses 52 may be formed on color filters 50 from the back side of the image pixel array.

Various embodiments have been described illustrating backside illumination (BSI) image sensors that exhibit reduced crosstalk. The BSI image sensors may be used in any electronic device.

A BSI image sensor may be used to reduce pixel crosstalk and increase performance. In one embodiment, photodiodes and associated floating diffusion regions are formed in a front surface of a p-type silicon substrate. Diffusion regions for transistors and other circuitry may be formed in the front surface of the substrate. A dielectric stack may be formed on the front surface of the substrate. The dielectric stack may include layers of silicon oxide or other dielectrics within which conductive interconnect structures are formed. The interconnect structures typically include metal interconnect routing lines and vias.

Light guides may be formed in the dielectric stack to help increase pixel performance. The light guides may, for example, have a metal reflector or multilayer interference filter reflector formed in the dielectric stack. The light guides and the reflectors may serve to reflect incoming light that penetrates the back surface of the silicon substrate back towards their respective photodiodes. Reflecting light using light guides in this way may increase the quantum efficiency of image sensors and reduce pixel crosstalk.

A silicon carrier may be formed on the dielectric stack to provide structural support for the BSI image sensor and to prevent light from reaching the front surface of the substrate through the carrier.

The silicon substrate may have a back surface. A color filter array may be formed on the back surface of the substrate. The color filter array may, for example, be a Bayer filter. Microlenses may be formed on the color filter array to help direct incoming light towards the respective photodiodes.

During operation of the BSI image sensor, light may enter through the microlenses. The incoming light may pass through the color filter arrays into the substrate. A portion of the light may be absorbed by the photodiodes during a first pass. Light that is not absorbed by the photodiodes may enter the dielectric stack.

The light guides in the dielectric stack may reflect the unabsorbed portion of the incoming light back towards the photodiodes for a second pass of absorption. Operating BSI image sensors using reflective light guides may significantly boost image pixel performance.

The foregoing is merely illustrative of the principles of this invention which can be practiced in other embodiments.

What is claimed is:

1. A backside illumination image sensor, comprising:
a substrate having front and back surfaces;
photodiodes formed in the substrate that receive light through the back surface; and
a dielectric stack formed on the front surface of the substrate, wherein the dielectric stack includes light guides each of which is associated with a respective one of the photodiodes, wherein the dielectric stack comprises dielectric material having a given index of refraction and wherein the light guides are formed from dielectric material having a different index of refraction than the given index of refraction.

2. The image sensor defined in claim 1, wherein the dielectric stack comprises dielectric material having a given index of refraction and wherein the light guide is comprises dielectric material having a higher index of refraction than the given index of refraction.

3. The image sensor defined in claim 2, further comprising floating diffusion regions formed in the substrate.

4. The image sensor defined in claim 3, wherein the dielectric stack further includes interconnect structures and wherein the interconnect structures are connected to the floating diffusion regions.

5. The image sensor defined in claim 4, wherein each light guide is surrounded by some of the interconnect structures.

6. The image sensor defined in claim 5, wherein each light guide includes a reflective structure that reflects some of the light that is received through the back surface through the associated photodiode towards the back surface.

7. The image sensor defined in claim 6, wherein the reflective structures comprise metal formed in a metal routing layer in the dielectric stack.

8. The image sensor defined in claim 6, wherein the reflective structures comprise multilayer interference filters that are formed using multiple layers of dielectric material having alternating high and low indices of refraction.

9. The image sensor defined in claim 1, further comprising any array of color filters formed on the back surface of the substrate and microlenses formed on array of color filters.

10. The image sensor defined in claim 9, wherein at least some of the color filters and light guides are laterally aligned with respect to the photodiodes and wherein at least some of the color filters and light guides are laterally offset with respect to the photodiodes.

11. A backside illumination image sensor, comprising:
a substrate having front and back surfaces;
photodiodes formed in the substrate that receive light through the back surface; and
a dielectric stack that is formed from dielectric material having a given index of refraction and that is formed on the front surface of the substrate, wherein the dielectric stack includes light guides each of which is associated with a respective one of the photodiodes and each of which includes a reflective structure which reflects some of the light that is received through the back surface through the associated photodiode towards the back surface, and wherein the light guides are formed from dielectric material having a different index of refraction than the given index of refraction.

12. The image sensor defined in claim 11, wherein the reflective structures comprise metal formed in a metal routing layer in the dielectric stack.

13. The image sensor defined in claim 11, wherein the reflective structures comprise multilayer interference filters that are formed using multiple layers of dielectric material having alternating high and low indices of refraction.

14. The image sensor defined in claim 11, wherein at least some of the reflective structures are laterally aligned with respect to the photodiodes and wherein at least some of the reflective structures are laterally offset with respect to the photodiodes.

15. The image sensor defined in claim 11, comprising:
a color filter array on the back surface of the substrate; and
a carrier board on the dielectric stack that provides structural support.

16. A method of forming a backside illumination image sensor having a substrate with front and back surfaces, comprising:
forming a plurality of photodiodes in the substrate;
forming a dielectric stack on the front surface of the substrate, wherein the dielectric stack includes a plurality of light guides each of which is associated with a respective one of the photodiodes, wherein the dielectric stack comprises dielectric material having a given index of refraction and wherein the light guides are formed from dielectric material having a different index of refraction than the given index of refraction; and
forming a carrier on the dielectric stack.

17. The method defined in claim 16, wherein forming the carrier comprises forming a carrier that has sufficient thickness to prevent light from reaching the front surface of the substrate through the carrier.

18. The method defined in claim 16, wherein forming the dielectric stack comprises forming the dielectric stack from a first dielectric material having a given index of refraction and forming the light guides in the dielectric stack from a second dielectric material having a higher index of refraction than the given index of refraction.

19. The method defined in claim 18, wherein forming the dielectric stack comprises forming a metal structure formed for each light guide in a metal routing layer in the dielectric stack, wherein the metal structure reflects some of the light that is received through the back surface through the associated photodiode towards the back surface.

20. The method defined in claim 18, wherein forming the dielectric stack comprises forming a multilayer interference filter for each light guide using multiple dielectric layers having alternating high and low indices of refraction and wherein each multilayer interference filter reflects some of the light that is received through the back surface through the associated photodiode towards the back surface.

* * * * *